United States Patent [19]

Hamamura et al.

[11] Patent Number: 4,867,836

[45] Date of Patent: Sep. 19, 1989

[54] FILM PEELING APPARATUS

[75] Inventors: Fumio Hamamura, Kanagawa; Shigeo Sumi, Saitama, both of Japan

[73] Assignee: Somar Corporation, Tokyo, Japan

[21] Appl. No.: 905,411

[22] Filed: Aug. 29, 1986

[30] Foreign Application Priority Data

| | | | |
|---|---|---|---|
| Aug. 30, 1985 | [JP] | Japan | 60-191735 |
| Aug. 30, 1985 | [JP] | Japan | 60-191736 |
| Aug. 30, 1985 | [JP] | Japan | 60-191737 |
| Aug. 31, 1985 | [JP] | Japan | 60-192909 |
| Dec. 13, 1985 | [JP] | Japan | 60-280796 |
| May 2, 1986 | [JP] | Japan | 61-23175 |

[51] Int. Cl.$^4$ ............................ B32B 31/18
[52] U.S. Cl. .................... 156/584; 156/344
[58] Field of Search ............... 156/344, 584

[56] References Cited

U.S. PATENT DOCUMENTS

| | | | |
|---|---|---|---|
| 4,165,251 | 8/1979 | Matsumoto et al. | 156/584 |
| 4,183,751 | 1/1980 | Matsumoto et al. | 156/584 X |
| 4,421,608 | 12/1983 | McBride | 156/344 X |
| 4,631,110 | 12/1986 | Tsumura et al. | 156/584 |
| 4,724,032 | 2/1988 | Kay | 156/344 |

FOREIGN PATENT DOCUMENTS

| | | |
|---|---|---|
| 275186 | 6/1978 | Fed. Rep. of Germany . |
| 0087551 | 9/1983 | Fed. Rep. of Germany . |
| 3339723 | 5/1985 | Fed. Rep. of Germany . |
| 7723200 | 3/1978 | France . |
| 58-091782 | 5/1983 | Japan . |

OTHER PUBLICATIONS

Patent Abstracts of Japan, vol. 9, No. 6 (P-326) [1729], 1/11/85; & JP-A-59 154 447 (Hitachi Kasei Kogyo K.K.), 9/3/84.

*Primary Examiner*—Robert A. Dawson
*Attorney, Agent, or Firm*—Sughrue, Mion, Zinn, Macpeak & Seas

[57] ABSTRACT

A film peeling apparatus for peeling a film from a substrate comprises film raising means for raising a part of the film from the substrate, and fluid jetting means for jetting fluid into between the film thus raised and the substrate, the film raising means including a brush or an adhesive member, so that the film the part of which has been raised from the substrate can be readily, positively and instantaneously peeled from the substrate by jetting the fluid.

13 Claims, 12 Drawing Sheets

FILM PEELING APPARATUS

BACKGROUND OF THE INVENTION

This invention relates to a film peeling technique, and more particularly to a technique which can be effectively employed to peel a protective film from the substrate.

In a printed circuit board used in an electronic device such as a computer, a predetermined circuit is formed with copper on one or both sides of an insulated substrate.

A printed circuit board of this type can be manufactured as follows: First, a laminate consisting of a photosensitive resin (photo-resist) layer and a translucent resin film (protective film) for protecting the photosensitive resin layer is thermally formed on the conductive layer of the insulated substrate under pressure. Thereafter, a circuit pattern film is laid over the laminate thus formed, and the photosensitive resin layer is exposed to light through the circuit pattern film and the translucent resin film for a predetermined period of time. After the translucent resin film is peeled off, the photosensitive resin layer thus exposed to light is subjected to developing to form an etching mask pattern. Thereafter, the unnecessary parts of the conductive layer are removed by etching, to obtain a printed circuit board having the predetermined circuit pattern.

In the above-described printed circuit board manufacturing method, in developing the photosensitive resin layer it is necessary to peel the translucent resin film off. The film peeling operation is manually carried out. As the film is considerably thin, the printed circuit board may be damaged or broken if the force of peeling the film off is not uniform. That is, the person peeling the film off must be dextrous with his or her fingers and skillful.

Accordingly, it takes a relatively long time to peel the translucent resin film off, and therefore the time required for manufacturing the printed circuit board is increased by that long amount of time.

SUMMARY OF THE INVENTION

Accordingly, a first object of this invention is to provide a film peeling apparatus which can readily, instantaneously and positively peel a film from the substrate.

A second object of the invention is to provide a film peeling apparatus which can reduce the time required for peeling a film from the substrate.

A third object of the invention is to provide a film peeling apparatus which can readily, instantaneously and positively peel a film from the substrate, while protecting the film from damage arising from to the difficulty that the film peeling stress is not uniform.

A fourth object of the invention is to provide a film peeling apparatus which can readily, instantaneously and positively peel a film from the substrate while protecting the film from damage attributing to the difficulty that the film peeling stress is not uniform, and can automatically remove from the apparatus the film thus peeled from the substrate.

A film peeling apparatus for peeling a film from the substrate, according to the invention, comprises: film raising means for raising a part of the film from the substrate; and fluid jetting means for jetting fluid into between the film thus raised and the substrate, so that the film the part of which has been raised from the substrate can be readily, instantaneously and positively peeled from the substrate; and accordingly the time required for peeling the film from the substrate can be shortened as much.

According to another aspect of the invention, the apparatus further comprises: a peeled film guide member for setting a peeling angle in peeling the film from the substrate by the fluid jetting means, so that the difficulties that the film peeling position changes and the peeling stress becomes non-uniform are prevented and the film can be protected from damage.

According to a further aspect of the invention, the apparatus further comprises: a film removing means for removing from said apparatus the film guide by the peeled film guide member, so that the film is automatically removed out of the apparatus while being peeled off the substrate.

According to the present invention, the guide members may be formed to be movable linearly and/or angularly. Also, the raising means may include a pair of projected press members.

The nature, principle and utility of the invention will become more apparent from the following detailed description when read in conjunction with the accompanying drawings.

DETAILED DESCRIPTION OF THE PREFERRED EMBODIMENTS

This invention will be described with reference to an apparatus for peeling a protective film from a printed circuit board to which the technical concept of the invention is applied.

In the accompanying drawings, like parts are designated by like reference numerals or characters.

Figure 1:
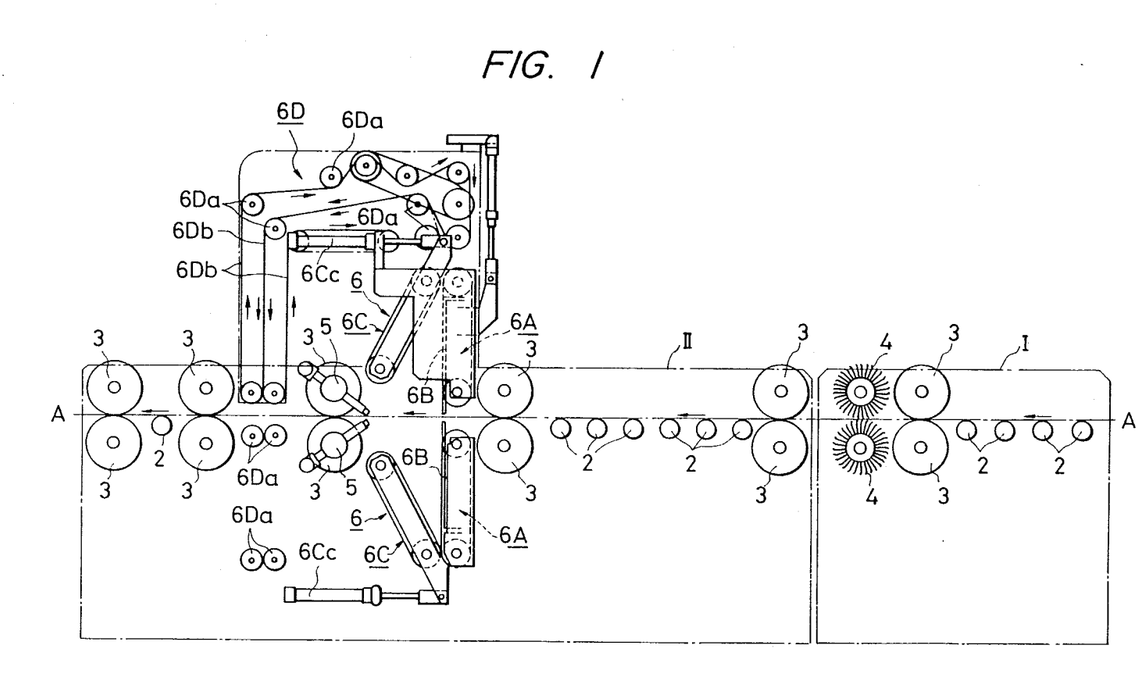
FIG. 1 is a sectional view outlining the arrangement of a film peeling apparatus which is a first embodiment of this invention.

FIG. 1 shows a protective film peeling apparatus (hereinafter referred to merely as "a film peeling apparatus", when applicable) which is a first embodiment of the invention.

The film peeling apparatus, as shown in FIG. 1, comprises: a film raising device I and a film peeling device II.

Figure 2:
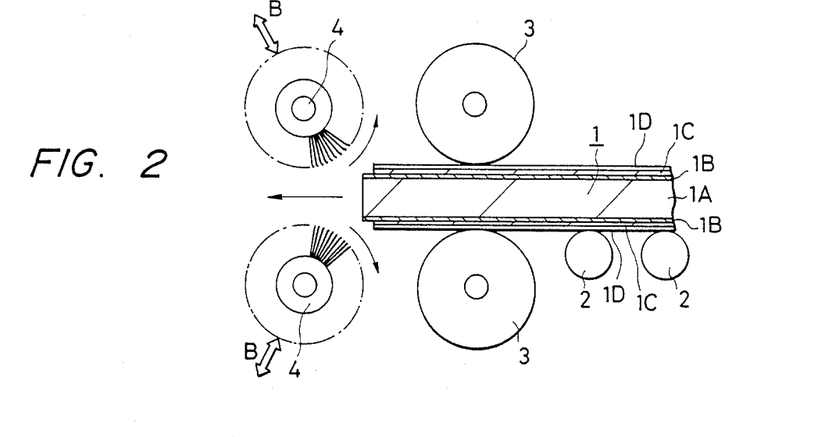
FIG. 2 is an enlarged sectional view of a film raising device shown in FIG. 1.

The film raising device I, as shown in FIG. 1 and FIG. 2 (an enlarged sectional view), comprises: rollers 2 for conveying printed circuit boards 1; conveyance control rollers 3; and film raising members 4.

In the printed circuit board 1, a conductive layer 1B of copper or the like is formed on one or both sides of an insulated substrate 1A. A laminate consisting of a photo-sensitive resin layer 1C and a translucent resin film (or a protective film) 1D is formed on the conductive layer 1B of the printed circuit board 1. FIG. 2 shows the photo-sensitive resin layers 1C which have been exposed to light in a predetermined pattern.

The conveying rollers 2 and the conveyance control rollers 3 are so designed as to convey the printed circuit board 1 in the direction of the arrow along the path of conveying as indicated by line A—A in FIG. 1.

Figure 3:
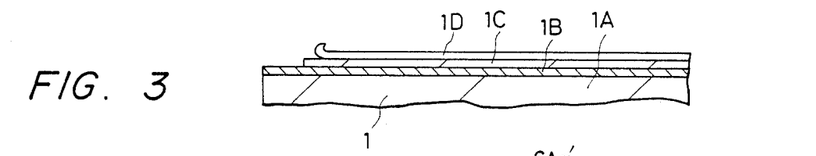
FIG. 3 is an enlarged sectional view of a printed circuit board shown in FIG. 2.

The film raising member 4 is so designed that, when the end of the printed circuit board 1 abuts against the film raising member, the latter raises a part of the translucent resin film 1D as shown in FIG. 3. The film raising member 4 comprises a rotor and a brush made up of a plurality of hard needles of resin or steel formed around the rotor. The hard needles of the brush are not uniform in length so that, even if the abutment of the printed circuit board against the film raising member fluctuates, a part of the translucent resin film 1D can be positively raised. Each of the film raising members 4 may be so designed that, after a part of the translucent resin film 1D is raised, it is moved away from the path of conveyance as indicated by the arrow B in FIG. 2, in order to prevent the photosensitive resin layer 1C from being damaged or broken by the brush.

A part of the translucent resin film 1D smaller in the force of adhesion than the photosensitive resin layer 1C may readily be raised by the film raising member 4 simple in construction which comprises the rotor and the brush as was described above. That is, it is unnecessary that the operator be dextrous with his fingers and skillful in order to raise the translucent resin film 1D.

As the film raising member 4 is disposed on the path of conveyance of the printed circuit board, the translucent resin film 1D can be automatically raised.

Each of the translucent resin films 1D partially raised is conveyed to the film peeling device II while being pressed by the conveying rollers 2 and the conveyance control rollers 3; however, as it is not pressed with heat, it will never stick to the photosensitive resin layer 1C again.

Figure 4:
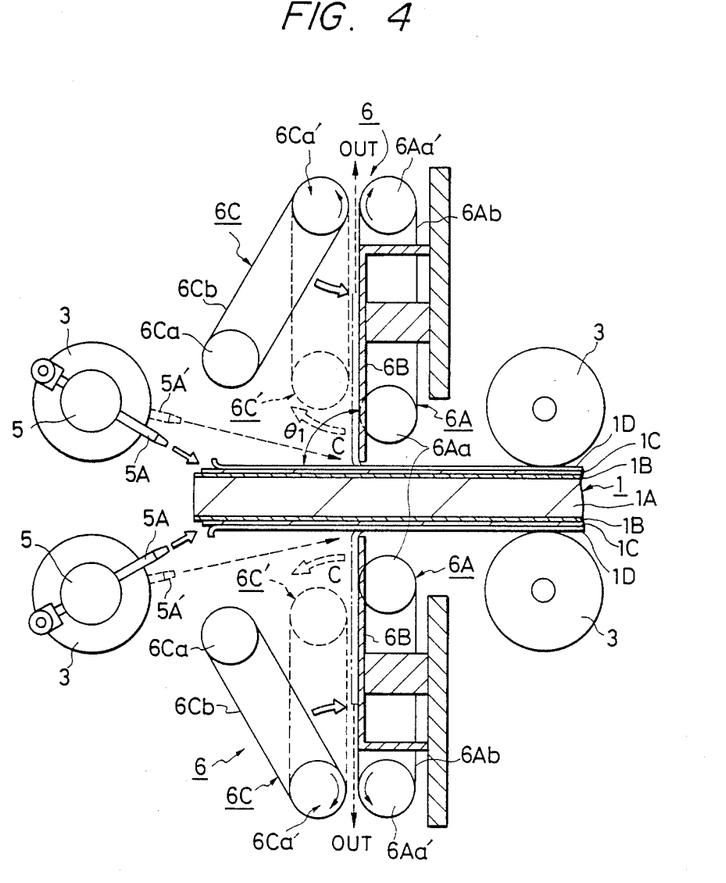
FIG. 4 is an enlarged sectional view of a film peeling device shown in FIG. 1.

The film peeling device II, as shown in FIG. 1 and FIG. 4 (an enlarged sectional view), mainly comprises: the conveying rollers 2; conveyance control rollers 3; fluid jetting devices 5; and film removing devices 6.

Each of the fluid jetting devices 5 is so designed as to jet pressurized fluid, for instance gas such as air or inert gas or fluid such as water, through its nozzle 5A. In other words, the fluid jetting device 5 is so designed as to apply the pressurized fluid directly to the space between the photosensitive resin layer (the substrate) 1C and the raised translucent resin film 1D of the printed circuit board 1 which has been conveyed to a predetermined position by the conveyance control rollers 3.

Each of the film removing devices 6 comprises: a stationary belt conveyer 6A; a peeled film guide member 6B; a movable belt conveyor 6C; and a film removing belt mechanism 6D.

Figure 5:
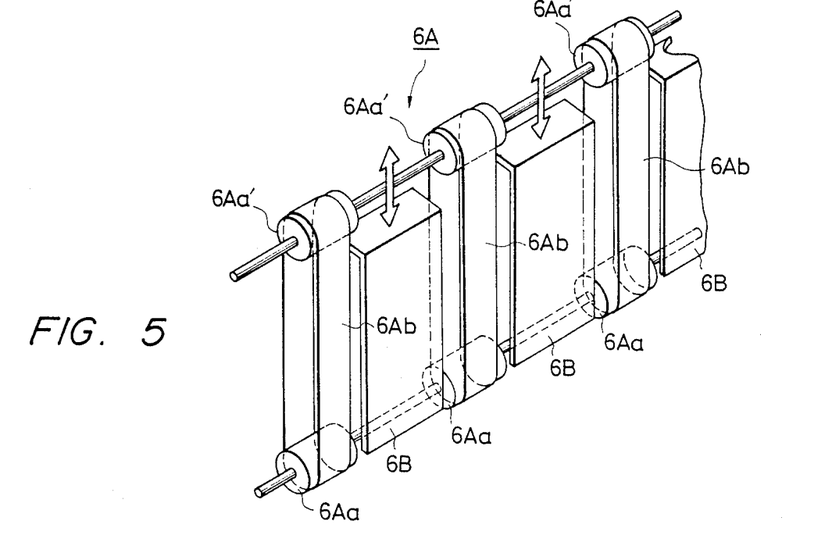
FIG. 5 is a perspective view showing essential components of a stationary belt conveyor and a peeled film guide member in FIG. 4.

The stationary belt conveyor 6A, as shown in FIG. 1, FIG. 4 and FIG. 5 (a perspective view showing essential components), comprises: a plurality of pairs of rollers 6Aa and 6Aa' and belts 6Ab laid over the pairs of rollers 6Aa and 6Aa'. The stationary belt conveyor 6A thus constructed operates to remove the translucent resin film 1D which has been peeled off by the fluid jetting device 5.

Each of the peeled film guide members 6B is provided on the housing of the film peeling device II on the side of the stationary belt conveyor 6A, and its guide surface is substantially flush with the belts 6Ab. The peeled film guide member is so designed that the translucent resin film 1D peeled off by the film raising member 4 and the fluid jetting device 5 is stuck to the guide member by the indirect fluid pressure from the fluid jetting device or the static electricity which is generated when it is peeled off.

The peeled film guide member 6B is so designed as to determine the angle of peeling of the translucent resin film 1D with respect to the direction of conveyance of the printed circuit board 1. More specifically, the peeled film guide member is so designed that the angle of peeling of the translucent resin film 1D with respect to the direction of conveyance of the printed circuit board 1 is obtuse so that the guide member sufficiently retains the peeled translucent resin film 1D and the peeling position of the translucent resin film 1D is maintained unchanged while the peeling stress is also maintained uniform. Furthermore, the peeled film guide member 6B is so designed that the guide surface for the translucent resin film 1D forms a substantially right angle $\theta_1$ with the direction of conveyance of the printed circuit board 1. In this case, in order to make the angle of peeling of the translucent resin film 1D obtuse, the speed of conveyance of the printed circuit board 1 is made substantially equal to or higher than the speed of peeling and conveying of the translucent resin film 1D.

A clearance is provided between the end of the peeled film guide member 6B and the printed circuit board 1 to the extent that the end of the peeled film guide member 6B is not rubbed by the printed circuit board. The end portion of the peeled film guide member 6B is arcuate in section, having a small radius of curvature. The radius of curvature is for instance 3 mm or smaller.

As is apparent from the above description, by providing the peeled film guide member 6B determining the angle of peeling of the translucent resin film 1D at the peeling position of the film 1D, the difficulties that the peeling position of the translucent resin film 1D changes and the peeling stress becomes non-uniform can be prevented, and therefore the photosensitive resin layer 1C can be protected from damage.

Each of the movable belt conveyors 6C, as shown in FIGS. 1 and 4, comprises: a plurality of pairs of rollers 6Ca and 6Ca'; and belts 6Cb laid over the rollers 6Ca and 6Ca'. The movable belt conveyor 6C is swung about the rollers 6Ca on one side by an air cylinder 6Cc so that it comes near or contacts the belts 6Ab of the stationary belt conveyor 6A or the guide member 6B. The movable belt conveyor 6C supports the translucent resin film 1D partially peeled by the fluid jetting device 5 so that the film 1D is removed while being peeled off.

As each film removing device 6 is made up of the stationary belt conveyor 6A, the peeled film guide member 6B and the movable belt conveyor 6C as described above, the angle of peeling of the translucent resin film 1D peeling off by the fluid jetting device 5 can be set to a predetermined value, and the difficulties that the peeling position of the translucent resin film 1D changes and the peeling stress becomes non-uniform can be prevented. In addition, the translucent resin film 1D can be automatically removed in the direction of the arrow OUT in FIG. 4 while being positively supported by the stationary belt conveyor 6A and the movable belt conveyor 6C.

The film removing belt mechanism 6D, as shown in FIG. 1, comprises a plurality of rollers 6Da and a pair of belts 6Db, to remove the translucent resin film 1D on the upper side of the printed circuit board 1.

The aforementioned movable belt conveyors may be so modified that they are driven by electromagnetic solenoids or hydraulic cylinders instead of the air cylinder 6C.

The film raising device I and the film peeling device II are disposed in the path of conveyance of the printed circuit board 1 as described above. Therefore, a part of each translucent resin film 1D of the printed circuit board 1 is raised, and is then peeled off by the fluid jetting device 5 readily and instantaneously. In this operation, the photosensitive resin layer 1C is protected from damage, and the translucent resin film 1D is automatically removed with high reliability. Therefore, the time required for removing the translucent resin film can be remarkably shortened.

After the translucent resin films 1D have been peeled off the printed circuit board 1 by the film peeling device II, the printed circuit board 1 is delivered by the conveyance control rollers 3 and the conveying rollers 2 to a developing device adapted to develop the photosensitive resin layers 1C.

In the above-described embodiment, the film raising members (brushes) 4 are made of steel or resin. However, the film raising members may be made of any material which is hard enough to raise the translucent resin film 1D. Furthermore, in the above-described embodiment, the brush is made up of a number of needle-like wires. However, it may be made up of a number of plates.

The above-described embodiment may be so modified that after the translucent resin film 1D is peeled off by the fluid jetting device 5 and stuck to the guide surface of the peeled film guide member 6B, the latter 6B is moved from the printed circuit board 1. This will be described in more detail. First, as shown in FIG. 4, the translucent resin film 1D peeled off by the fluid jetting device 5 is stuck to the peeled film guide member 6B. Next, the stationary conveyor 6A and the peeled film guide member 6B are moved in the direction of the arrow C in FIG. 4 (or in the direction of conveyance), to provide a space between the peeled film guide member 6B and the printed circuit board 1. The peeled film guide member 6B is driven by a drive source such as an air cylinder, a hydraulic cylinder or an electromagnetic solenoid. After the translucent resin film 1D stuck to the guide surface of the peeled film guide member 6B is supported by the movable belt conveyor 6C, the nozzle 5A is moved to the position 5A' so as to jet the fluid into the space. That is, in the modification, the peeled film guide member 6B is moved to provide the space between the peeled film guide member 6B and the printed circuit board 1, and the fluid is jetted into the space thus provided, so that the fluid is jetted between the translucent resin film 1D and the photosensitive resin layer 1C of the printed circuit board 1 which are located at the rear of the peeled film guide member 6B (with respect to the direction opposite to the direction of conveyance). Therefore, the translucent resin film 1D can be widely, positively and instantaneously peeled off.

In a second embodiment of the invention, the angle of each peeled film guide member in a film peeling device can be made acute or changed.

Figure 6:
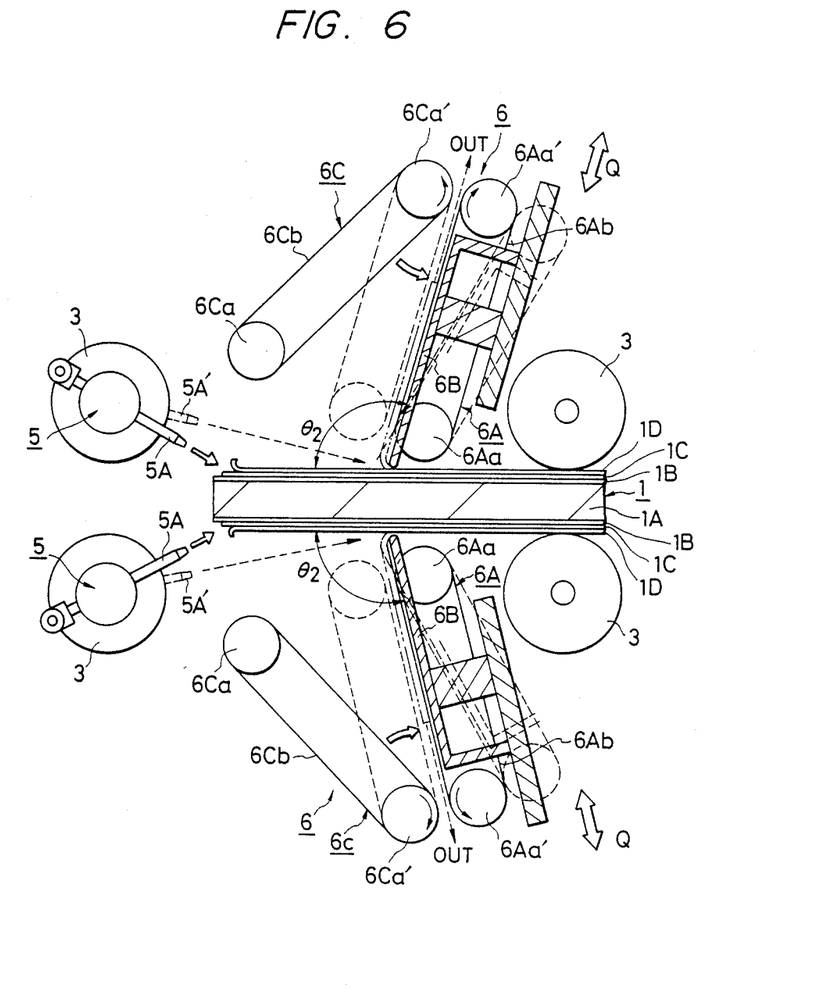
FIG. 6 is an enlarged sectional view showing essential components of a film peeling device in a second embodiment of the invention.

The film peeling device is so designed that the guide surface of the film guide member 6B forms an obtuse angle $\theta_2$ with respect to the direction of conveyance of the printed circuit board 1 as shown in FIG. 6. The speed of conveyance of the printed circuit board 1 is substantially equal to the speed of peeling and conveying of the translucent resin film 1D.

As the guide surface of the peeled film guide member 6B forms the obtuse angle with respect to the direction of conveyance of the printed circuit board 1 as was described above, the peeling angle can be positively made obtuse against the flexibility of the translucent resin film 1D. Therefore, the difficulties that the peeling position changes and the peeling stress becomes non-uniform can be more positively prevented, and the photosensitive resin layer 1C can be more positively protected from damage.

The peeled film guide member 6B may be so modified that the angle between the guide surface of the translucent resin film 1D and the direction of conveyance of the printed circuit board 1 can be changed in a range of from right angle $\theta_1$ to the obtuse angle $\theta_2$. The peeled film guide member 6B is driven by a drive means such as an air cylinder, a hydraulic cylinder or an electromagnetic solenoid.

As was described above, the angle of the guide surface of the peeled film guide member 6B with respect to the direction of conveyance of the printed circuit board 1 can be changed. Therefore, the peeling angle of the translucent resin film 1D can be set to the most suitable value according to the speed of conveyance of the printed circuit board 1, the peeling and conveying speed, and the peeling stress.

In a third embodiment of the invention, film raising units for a film peeling device are made up of adhesive members.

Figure 7:
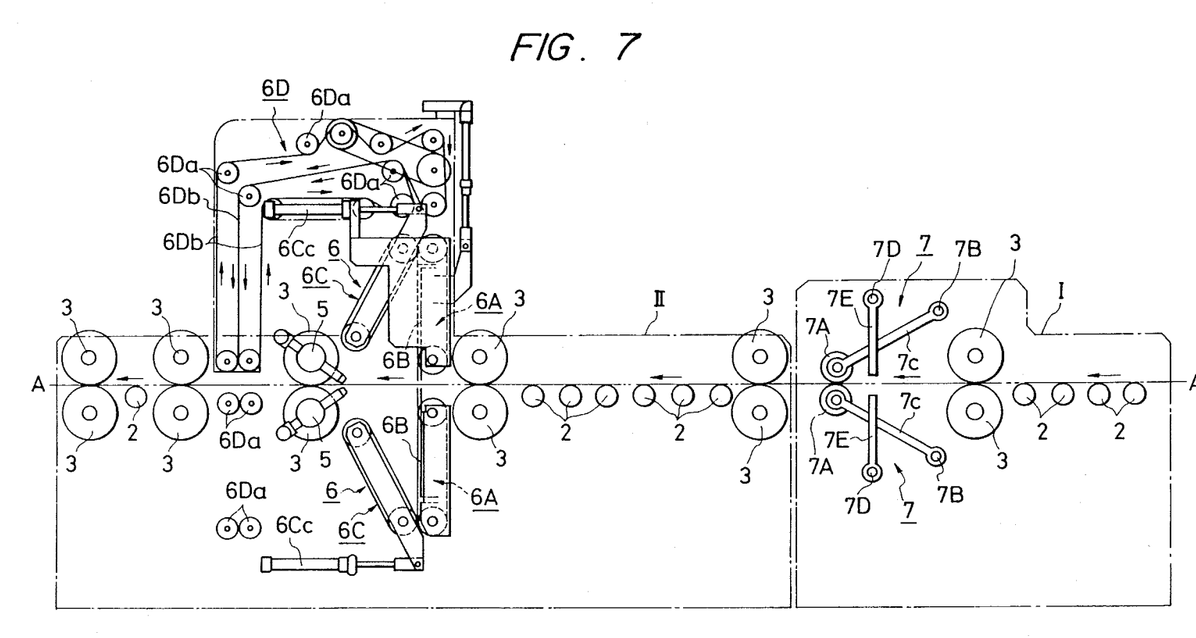
FIG. 7 is a sectional view outlining the arrangement of a film peeling apparatus which is third embodiment of the invention.
Figure 8:
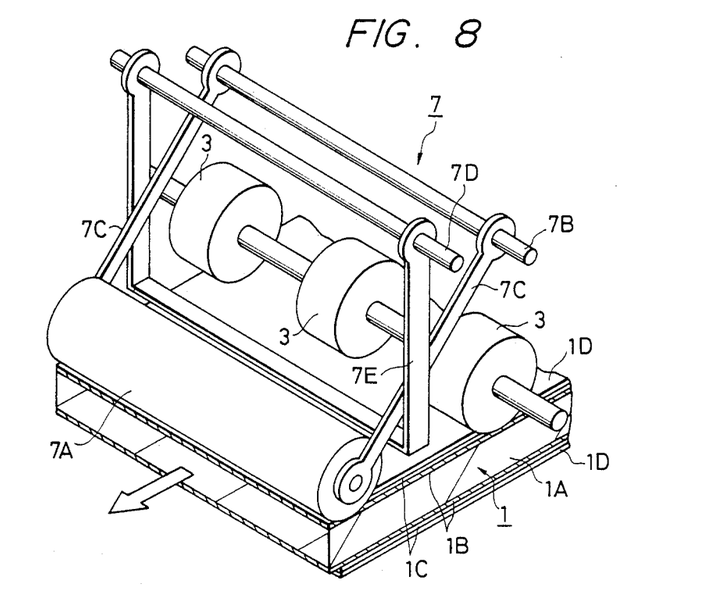
FIG. 8 is an enlarged perspective view of a film raising device in FIG. 7.

The film peeling apparatus, the third embodiment of the invention, is as shown in FIG. 7 (a sectional view outlining the arrangement thereof), and essential components of the film peeling device is as shown in FIG. 8 (an enlarged perspective view).

In the third embodiment, each of the film raising units 7, as shown in FIGS. 7 and 8, comprises: an adhesive member 7A formed by providing an adhesive material such as adhesive tape on a cylindrical rotor; arms 7C for swinging the adhesive member 7A about a rotating shaft 7B; and a removing member 7E which is swung about a rotating shaft 7D to remove the translucent resin film 1D from the adhesive member 7A. The adhesive member 7A and the removing member 7E are driven by a gear mechanism, a crank mechanism, an air cylinder, a hydraulic cylinder, an electromagnetic solenoid or the like (not shown).

Figure 9:
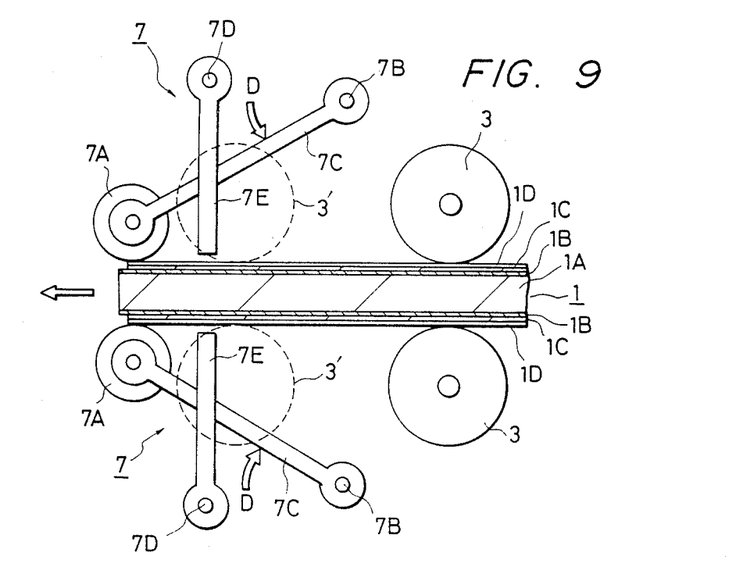
FIGS. 9 through 11 are enlarged sectional views for a description of the operation of the film raising device shown in FIG. 7.
Figure 10:
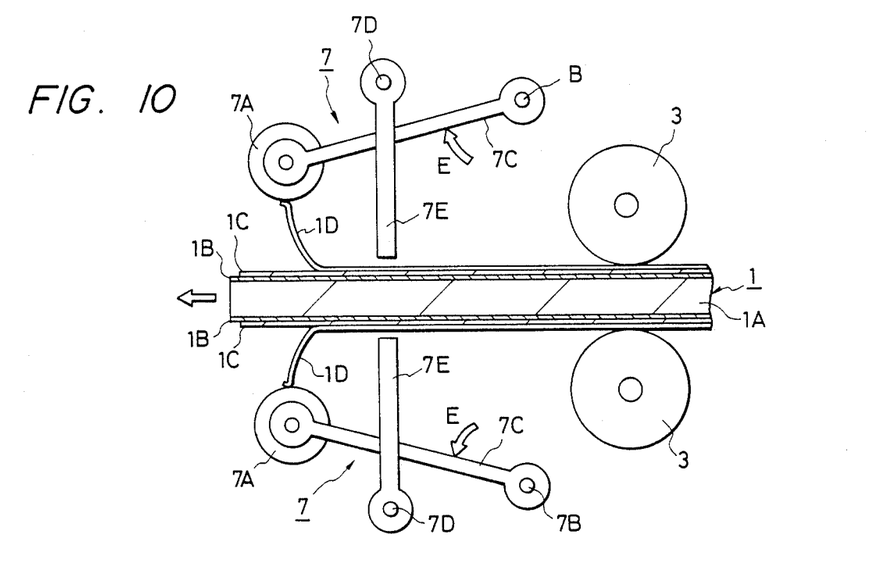
Figure 11:
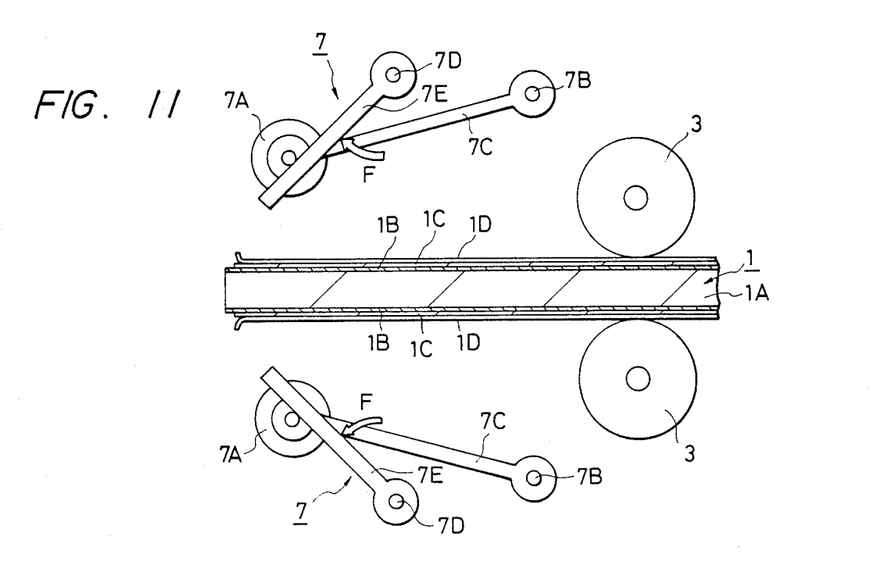

The film raising unit 7 is so designed that, when the end of the printed circuit board 1 comes to a predetermined position by the operation of the conveyance control rollers 3, as shown in FIG. 9 the arms 7C are swung in the direction of the arrow D, so that the adhesive member 7A abuts against the end of the translucent resin film 1D. Thereafter, as shown in FIG. 10, while the printed circuit board 1 is conveyed by the conveyance control rollers 3, the arms 7C are swung in the direction of the arrow E, so that the end portion of the translucent resin film 1D is raised by the adhesive member 7A because the force of adhesion of the photosensitive resin layer 1C and the conductive layer 1B is larger than that of the translucent resin film 1D and the photosensitive resin layer 1C. Thereafter, as shown in FIG. 11, the removing member 7E is swung in the direction of the arrow F, so that the transparent resin film 1D is removed from the adhesive member 7A.

As is apparent from the above description, the film raising unit 7 including the adhesive member 7A simple in construction can readily raise a part of the translucent resin film 1D smaller in the force of adhesion. Furthermore, since one part of the translucent resin film 1D can be raised merely by causing the adhesive member 7A to abut against it, no mechanical impact is applied to the printed circuit board, and in peeling the translucent resin film it is unnecessary that the worker is dextrous with his finger and skillful, and the photosensitive resin layer 1C will never be damaged.

As each of the film raising units 7 is disposed on the path of conveyance of the printed circuit board, a part of the translucent resin film 1D can be automatically raised.

The above-described embodiment may be so modified that the conveyance control rollers 3 (or the conveying rollers 2) are arranged as indicated by the dotted lines (3') in FIG. 9 so that they are adjacent to the adhesive members 7A of the film raising units 7. In this modification, it is unnecessary to use the removing member 7E; that is, immediately after the end portion of the translucent resin film 1D is raised by the adhesive member 7A, the film 1 can be removed from the adhesive member 7A. In other words, when, under the condition that the printed circuit board 1 is stopped by the conveyance control rollers 3, the translucent resin film 1D is raised, the adhesive member 7A swinging about the rotating shaft 7B is moved farther in the direction of conveyance than the printed circuit board 1, and therefore the translucent resin film 1D raised by the adhesive member 7A can be immediately removed from the adhesive member 7A. The removal of the translucent resin film 1D from the adhesive member 7A may be performed during the conveyance of the printed circuit board 1. In this case, it is necessary that the speed of movement of the arms 7C is higher than the speed of conveyance of the printed circuit board 1.

Figure 12:
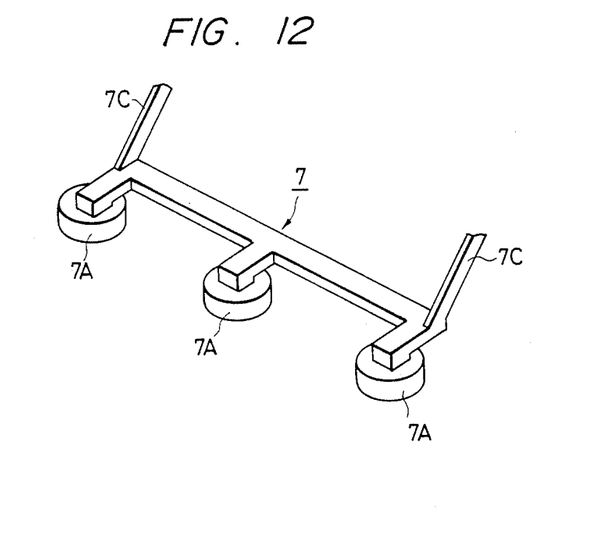
FIG. 12 is a perspective view showing essential components of one modification of the film raising device in the third embodiment of the invention.

The above-described film raising unit may be so modified that, as shown in FIG. 12, adhesive tape is provided on a fork-shaped support member to form adhesive members 7A.

Furthermore, the adhesive member 7A may be replaced by a cylindrical rotor which is adhesive.

The adhesive member 7A may be so designed that the adhesive tape is replaced by a new one whenever a predetermined number of printed circuit boards have been processed.

Referring back to FIGS. 5 and 6, the film peeling guide members 6B may be so designed in construction as to prevent the occurrence of the difficulties that, when the translucent resin film 1D is peeled off, the peeling position is varied, the peeling stress becomes non-uniform, and the photosensitive resin layer 1C is damaged or broken, and to guide the translucent resin film 1D in the film peeling direction. That is, the film peeling guide members 6B are so designed that the peeling angle $\theta$ of the translucent resin film 1D raised (which is the angle formed between the translucent resin film 1D which is to be peeled off and the same translucent resin film 1D which has been peeled off) is a right angle to an obtuse angle (90° to 150°, preferably about a right angle) with respect to the board 1.

Each of the film peeling guide members 6B is positioned close to the board 1 but without its end rubbing the board 1, and the guide member 6B is moved in the direction of the arrow Q so that, when the board 1 is conveyed, the photosensitive resin layer 1C will not be damaged.

The guide members 6B are moved, for instance, by a servo motor, an air cylinder or the like in synchronization with the peeling mechanism. Furthermore, the film peeling guide members 6B are so designed that they are moved when the translucent resin film 1D is supported by the stationary belt conveyor 6A and the movable belt conveyor 6C.

The film peeling guide members 6B thus provided stabilize the peeling position, and allow the application of uniform peeling stress to the translucent resin film 1D and the photosensitive resin layer 1C.

As was described above, the positions of the film peeling guide members 6B can be changed. Therefore, the film peeling guide members 6B can be positioned close to the board 1 so that the peeling means effectively acts on the entire peeling surface of the translucent resin film 1D from the end of the board 1 to the film peeling guide members 6B, with the results that the initial peeling effect is improved, and the translucent resin film 1D can be positively stuck onto the film peeling guide members 6B. On the other hand, where the film peeling guide members 6B are moved away from the board 1, the photosensitive resin film 1C can be protected from damage when the board 1 is conveyed.

Figure 14:
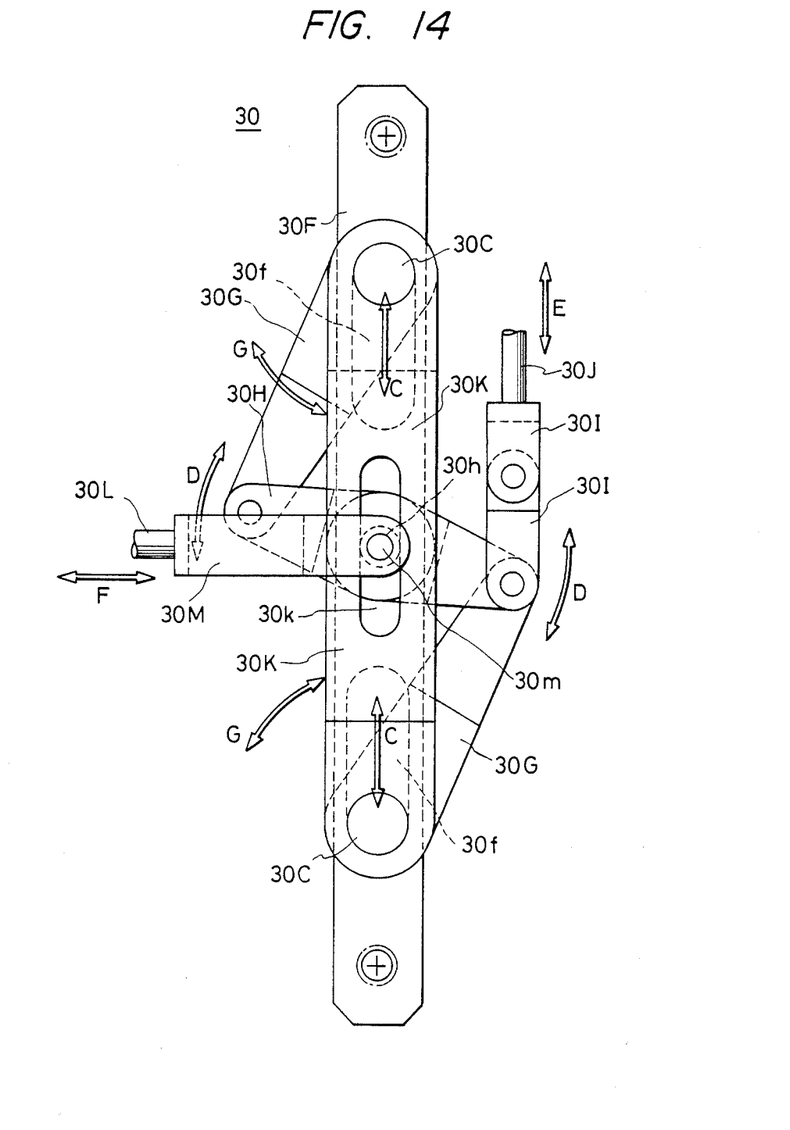
FIG. 14 is a structural drawing of the projected press mechanism of FIG. 13.
Figure 15:
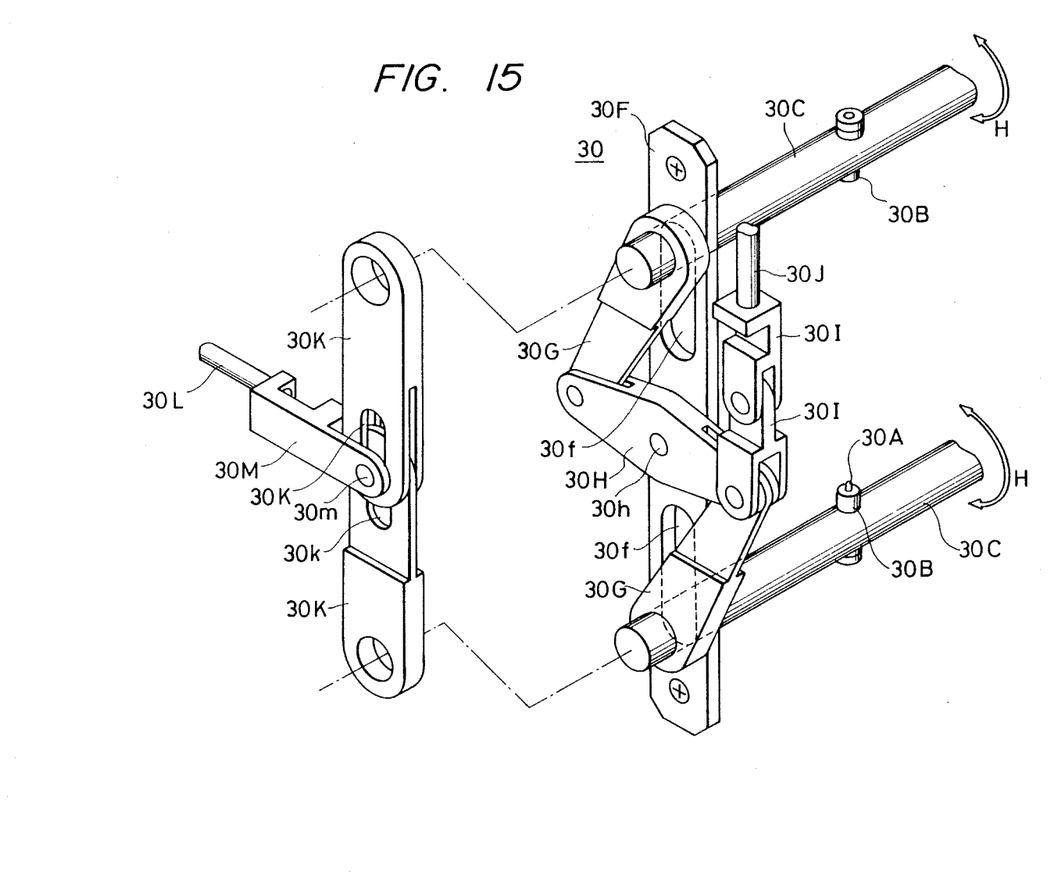
FIG. 15 is an expanded exploded view of FIG. 14.
Figure 16:
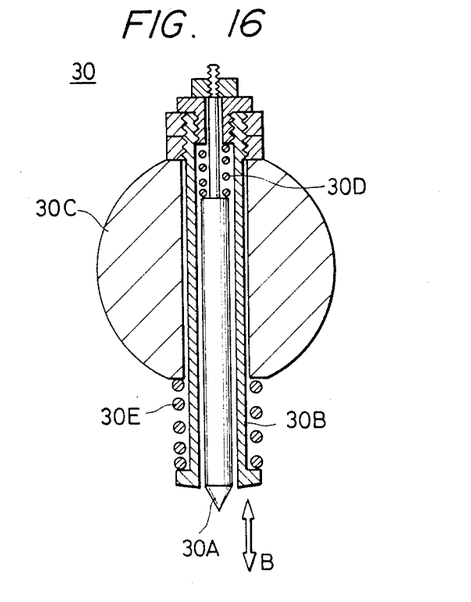
FIG. 16 is a partial sectional view of the projected press member of FIG. 15.

FIGS. 13 to 18 show another embodiment of the invention in which, a projected press mechanism 30 is used instead of the film raising members 4. The projected press mechanism 30 which comprises a plurality of projected press members 30A is installed on both sides of the printed circuit board 1, the projected press members 30A being arranged in the direction across the conveyance direction (the crosswise direction of the printed circuit board 1). Each projected press member 30A is needle-shaped as shown in FIG. 16 and formed so that the end of the laminated body composed of the photosensitive resin layer 1C and the translucent resin film 1D is pressed by the front end of the projected press member 30A. The projected press member 30A is also so arranged as not to bite into the interface between the conductive layer 1B and the photosensitive resin layer 1C when the projected press member 3A presses the end of the laminated body and to have an apex angle of, e.g., about 60 degrees to make the translucent resin film 1D peel off of the photosensitive resin layer 1C. Each of the projected press members 30A arranged opposite to each other is supported by a discrete projected press member supporting rotary shaft 30C through a holder 30B. The holder 30B, which is supplied with a code, is installed in such a manner as to slide along the through-hole of the projected press member supporting rotary shaft 30C.

The same or different elastic members 30C and 30E are installed between the projected press member 3A and the holder 3B and between the holder 30B and the projected press member supporting rotary shaft 30C, respectively. The elastic members 30D and 30E are installed in the direction of an arrow B, i.e., in such a manner as to act on the direction close to the printed circuit board 1. Accordingly, the position of the front end of the projected press member 30A can be changed by a given pressure in the direction of the arrow B relative to the projected press member supporting rotary shaft 30C.

One end (or both ends) of the projected press member supporting rotary shaft 30C is, as shown in FIGS. 14 and 15 rotatably coupled to one end of a moving arm member 30G through a guide slit 30f made in a guide member 30F. The guide member 30F is fixed to the apparatus body with machine screws and the like (not shown). The guide slit 30f is formed in the direction of an arrow C so as to guide the projected press member supporting rotary shaft 30C, i.e., the projected press member 30A.

The other end of each moving arm member 30G is rotatably secured to one of the opposite ends of a rotary arm member 30H secured rotatably on the rotary shaft 30h in the direction of an arrow D. The rotary arm member 30H is capable of moving each moving arm member 30G in the longitudinal direction of an arrow C.

The guide member 30F, the moving arm member 30G and the rotary arm member 30H for guiding the projected press member supporting rotary shaft 30C constitute the link mechanism of the projected press mechanism 30 for mutually nearing and parting the projected press member 30A installed on both sides of the printed circuit board 1 through the movement of the shaft 30J of the driving source for both surface use in the direction of an arrow E. The shaft 30J is coupled to one end of the rotary arm member 30H through an arm coupling member 30I. The members constituting the link mechanism each are prepared from material relatively hardly deformable against external force such as iron, aluminum alloy and rigid plastics. The driving power may be derived from a pneumatic or hydraulic cylinder, or a solenoid. The shaft 30J may be coupled to one end of the moving arm member 30G through the arm coupling member 30I but not limited to one end of the rotary arm member 30H.

By thus coupling the projected press member 30A to the driving source for both side use by means of the link mechanism, the projected press members 30A installed on both sides of the printed circuit board 1 each may be caused to contact or part from the surface of the printed circuit board 1 (movement in the direction of the arrow C). In other words, the link mechanism is capable of driving the both side projected press members 30A by means of the driving source for both side use without providing driving source for individually driving the projected press member 30A on both sides of the printed circuit board 1.

The guide member 30F, the moving arm members 30G and the rotary arm member 30H constituting the link mechanism are rigid bodies and the operating range of each is defined by the guide slit 30f and the rotary shaft 30h. In consequence, the projected press members 30A on both sides of the printed circuit board 1 can be controlled accurately and equally in terms of their operating quantity and time.

The link mechanism for coupling the projected press member 30a and the driving source for both side use can be made simpler in construction than what is formed with a rack and pinion or gear mechanism because the number of parts is smaller and each part is simpler in configuration.

At one end (or both ends) of each projected press member supporting rotary shaft 30C linked with the moving arm member 30G is installed a projected press member rotating arm member 30K whose one end is fixed. At the other end of each projected press member rotating arm member 30K is provided a slit 30k and the shaft 30m of the arm coupling member 30M connected to the shaft 30L of the driving source for both side use is passed through the slit 30k. In other words, the projected press member rotating arm member 30K is coupled to the shaft 30L of the driving source for both side use through the coupling arm member 30M. As the driving source for both side use, a ling mechanism similar to what has mentioned above may be used.

The projected press member rotating arm member 30K and the arm coupling member 30M constitute the projected press member pressing mechanism of the projected press mechanism 30 for rotating the projected press member rotating arm member 30K in the direction of the arrow G as a shaft L moves in the direction of an arrow F, rotating the projected press member supporting rotary shaft 30C in the direction of an arrow H and pressing the end of the laminated body.

The projected press member pressing mechanism thus constructed is capable of operating the projected press members 30A on both sides of the printed circuit board 1 with one driving source as in the case of the link mechanism for the projected press members 30A and controlling the operating quantity and time thereof accurately.

Moreover, tee projected press member pressing mechanism can simplify the coupling mechanism for coupling the projected press member 30A and the driving source.

Although the link mechanism or projected press member pressing mechanism and the driving source for both side use are installed on one side of the projected member supporting rotary shaft 30C, they may be installed on both sides according to the present invention.

Referring to FIGS. 13 through 18, the operation of the projected press mechanism 30 will be described briefly.

A thin film end detector (not shown) is used first. As a thin film end detector, use can be made of a touch sensor for electrically detecting the end of a thin film laid on the printed circuit board 1 or a photosensor for detecting the same optically.

Figure 13:
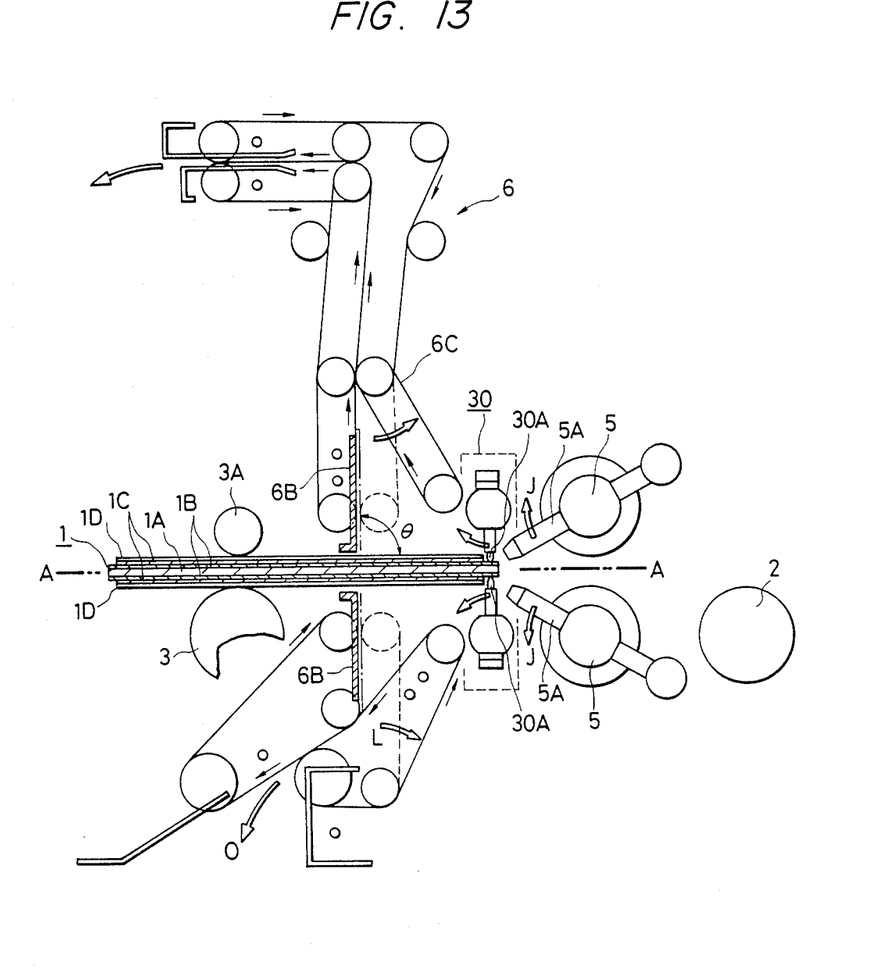
FIG. 13 is an enlarged traced side view of the principal portion of a film raising means of the invention.

When the end of a laminated body (thin film) stuck onto the printed circuit board is detected by the thin film end detector, pinch roller 3A shown in FIG. 13 is pressed against the printed circuit board 1 using a press means (not shown) and the conveyance of the printed circuit board 1 is temporarily stopped by the press means and a conveyance driving roller 3. At this time, material such as rubber having a high coefficient of friction is attached to the outer peripheral surface of the conveyance driving roller 3 opposite to the pinch roller 3A to prevent the position of the printed circuit board from shifting and the printed circuit board 1 is fixed by securely stopping the conveyance of the printed circuit board 1.

Figure 17:
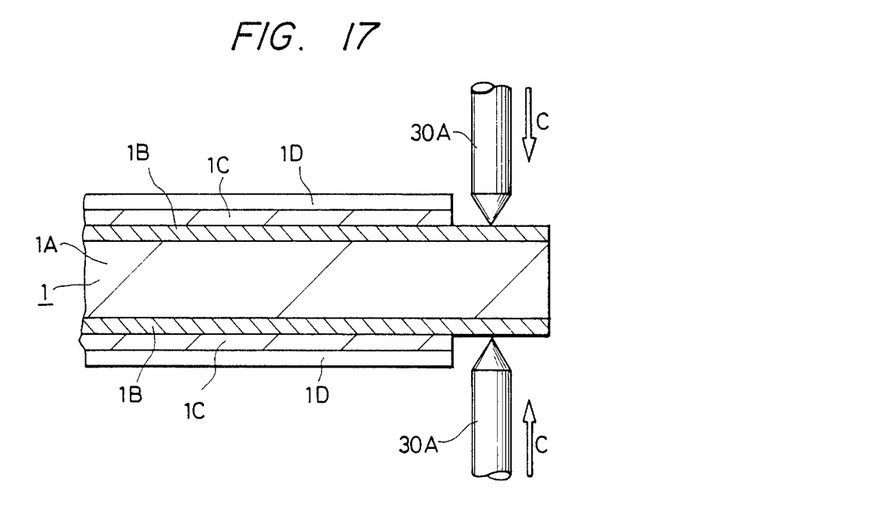
FIGS. 17 and 18 are sectional views of the principal portions of the printed circuit board of FIG. 13.
Figure 18:
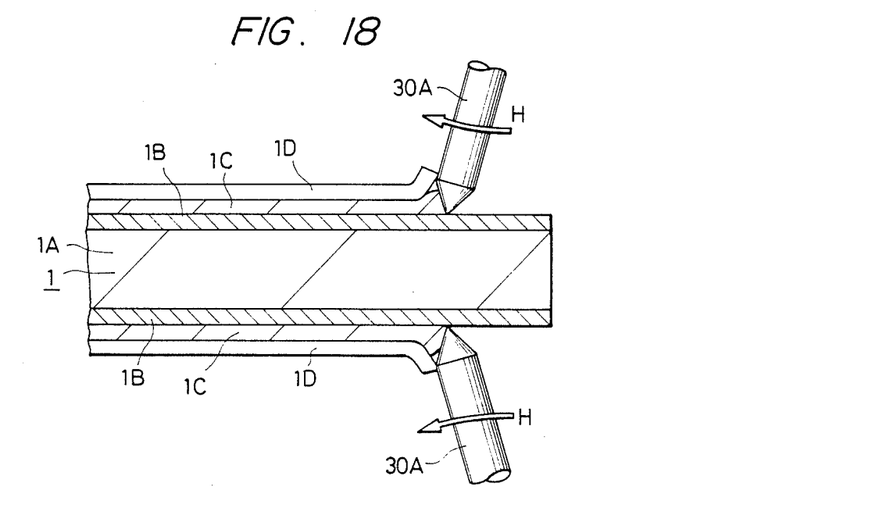

The shaft 30J of the driving source for both-side use coupled to the link mechanism is moved in the direction of an arrow E (upward in FIG. 14). This operation allows the link mechanism constituted by the rotary arm member 30H, the moving arm member 30G and the guide member 30F to operate and the projected press member supporting rotary shaft 30C is caused to move in the direction of the arrow C. As the projected press member supporting rotary shaft 30C moves, each of the front ends of the projected press members 30A on both sides of the printed circuit board 1 contacts the surface of the conductive layer 1B at the end of the laminated body as shown in FIG. 17. The contact is attained by the application of suitable force so that the elastic member 30D (30E) may have energy.

While the projected press member 30A is in contact with the conductive layer 1B, the shaft 30L of the driving source for both side use coupled to the projected press member pressing mechanism is operated (to the left in the drawing). This operation causes the projected press member pressing mechanism composed of the projected press member rotating arm member 30K and the arm coupling member 30M to operate and the projected press member supporting rotary shaft 30C is rotated in the direction of the arrow H. As the projected press member supporting rotary shaft 30C rotates, the front ends of the projected press members 30A on both sides of the printed circuit board 1 press the end of the laminated body.

By pressing the end of the laminated body composed of the photosensitive resin layer 1C and the translucent resin film 1D and stuck on the printed circuit board 1 with the projected press members 30A of the projected press mechanism 30, part of the translucent resin film 1D is peeled off the photosensitive plastic layer 1C, so that a gap can be produced in the interface. The gap is attributed to the fact that, because the photosensitive resin layer 1C is prepared from material softer than that for the translucent resin film 1D, the former is subjected to plastic deformation against the pressure applied by the projected press member 30A, whereas the adhesion of the latter to the former reduces before the latter is subjected to plastic deformation.

Moreover, the end of the translucent resin film 1D can be peeled off by the needle-shaped projected press member 30A which is simple in configuration.

Since the projected press member 30A is installed in the conveyance path of the printed circuit board, the end of the translucent resin film 1D can automatically be peeled off.

The translucent plastic film 1D thus peeled off once never sticks to the photosensitive plastic layer 1C again unless it is heated and adhesion bonded under pressure.

A plurality of projected press members 30A are installed in the direction across (crosswise direction) the conveyance direction of the printed circuit board 1 according to this embodiment in consideration of the case where the laminated body may be heat bonded distortedly on the printed circuit board 1. However, the present invention is not restricted to the above application. In other words, the projected press mechanism 30 may be so arranged as to provide the projected press members 30A each on both sides of the printed circuit board 1 as long as one ends of the photosensitive resin layer 1C and the translucent resin film are pressed to ensure that the latter is peeled off.

Although the projected press members 30A are arranged in the direction (crosswise direction) across the conveyance direction of the printed circuit 1 according to this embodiment, the projected press members 30A may be installed at the end or any place close to the corner of the laminated body still in the same direction as the conveyance direction of the printed circuit board 1. In this case, the nozzle 5A of the fluid spray mechanism 50 is set close to the projected press member 30A.

The link mechanism according to this embodiment has been arranged in the form of the projected press member pressing mechanism of the projected press mechanism 30. However, the construction of the projected press member pressing mechanism according to the present invention may be so arranged as to carry the printed circuit board 1 slight by rotating the conveyance driving roller 3 (or the pinch roller 3A) in such a state that the projected press member 30A makes contact with the surface of the printed circuit board 1 at the end of the laminated body and to press the end of the laminated body.

Moreover, the cross section of the projected press member supporting rotary shaft 30C in the direction across the axis of the shaft according to the present invention may be square with the view of increasing the accuracy of processing the through-hole into which the holder 30B is fitted and facilitating the processing.

While a few embodiments of the invention have been illustrated and described in detail, it is particularly understood that the invention is not limited thereto or thereby, and those skilled in the art can make various changes and modifications without departing from the invention. For instance, the technical concept of the invention can be applied to a device for peeling a protective film from a decoration board used as a building material.

As is apparent from the above description, this invention has the following effects or merits:

(1) The film peeling apparatus comprises the film raising means for raising a part of the film from the substrate, and the fluid jetting means for jetting the fluid into between the substrate and the film thus raised, according to the invention, so that the film a part of which has been raised can be readily, positively and instantaneously peeled from the substrate by jetting the fluid. That is, the film peeling device according to the invention can reduce the time required for peeling the film from the substrate.

(2) The apparatus further comprises the peeled film guide member for setting the peeling angle of the film peeled from the substrate by the fluid jetting means, so that the difficulties that the peeling position of the film changes and the peeling stress becomes non-uniform can be prevented, and accordingly the film is protected from damage.

(3) The apparatus further comprises the film conveying means for conveying the film guided by the peeled film guide member, so that the film can be removed while being peeled off.

What is claimed is:

1. A film peeling apparatus for peeling a film from a substrate, which comprises:

film raising means for raising only a part of said film from said substrate when said substrate is in a range of operation of said film raising means;

means for conveying said substrate with the part of said film being raised out of said range of operation of said film raising means; and fluid jetting means for jetting gas between said film thus raised and said substrate when said substrate is outside of said range of operation of said film raising means.

2. An apparatus as claimed in claim 1, in which said film raising means comprises a brush for raising a part of said film from said substrate.

3. An apparatus as claimed in claim 1, in which said film raising means comprises an adhesive member for raising a part of said film from said substrate.

4. A film peeling apparatus for peeling a film from a substrate, which comprises:

film raising means for raising only a part of said film from said substrate when said substrate is in a range of operation of said film raising means;

means for conveying said substrate with the part of said film being raised out of said range of operation of said film raising means;

fluid jetting means for jetting gas between said film thus raised and said substrate when said substrate is outside of said range of operation of said film raising means; and a peeled film guide member for setting a peeling angle in peeling said film from said substrate by said fluid jetting means.

5. An apparatus as claimed in claim 4, in which said peeled film guide member has a film guide surface set substantially at right angles with respect to the direction of conveyance of said substrate.

6. An apparatus as claimed in claim 4, in which said peeled film guide member has a film guide surface set substantially at an obtuse angle with respect to the direction of conveyance of said substrate.

7. An apparatus as claimed in claim 4, in which said peeled film guide member has a film guide surface whose angle with respect to the direction of conveyance of said substrate is variable in a range of from a right angle to an obtuse angle.

8. A film peeling apparatus for peeling a film from a substrate, which comprises:

film raising means for raising a part of said film from said substrate when said substrate is in a range of operation of said film raising means;

means for conveying said substrate with the part of said film being raised out of said range of operation of said film raised means;

fluid jetting means for jetting gas between said film thus raised and said substrate when said substrate is outside of said range of operation of said film raising means;

a peeled film guide member for setting a peeling angle in peeling said film from said substrate with said fluid jetting means; and film removing means for removing from said device said film guided by said peeled film guide member.

9. An apparatus as claimed in claim 8, in which said film removing means comprises:

a stationary belt conveyor provided with said peeled film guide member; and a movable belt conveyor for removing out of said device said film guided by said peeled film guide member while supporting said film.

10. A film peeling apparatus as claimed in any one of claims 4, 6 or 8, wherein said film guide member is angularly movable.

11. A film peeling apparatus as claimed in any one of claims 4 or 8, wherein said film guide member is linearly movable.

12. A film peeling apparatus as claimed in any one of claims 1, 4 and 8, wherein said film raising means includes at least one projected press member, and said press member comprises an elongate member having a tip portion for contacting an end of the film.

13. An apparatus as claimed in claims 1, 4, or 8, wherein said gas is air.

* * * * *